United States Patent [19]
Yasukazu

[11] Patent Number: 5,245,202
[45] Date of Patent: Sep. 14, 1993

[54] CONDUCTIVITY MODULATION TYPE MISFET AND A CONTROL CIRCUIT THEREOF

[75] Inventor: Seki Yasukazu, Kawasaki, Japan

[73] Assignee: Fuji Electric Co., Ltd., Kawasaki, Japan

[21] Appl. No.: 890,063

[22] Filed: May 28, 1992

[30] Foreign Application Priority Data

May 31, 1991 [JP] Japan .................................. 3-129476
Dec. 27, 1991 [JP] Japan .................................. 3-346633

[51] Int. Cl.$^5$ ...................... H01L 29/10; H01L 29/78; H01L 29/74
[52] U.S. Cl. ............................... 257/133; 257/146; 257/154; 257/163; 257/167; 257/175; 257/331; 257/334; 257/337; 257/378; 257/379
[58] Field of Search ............... 357/23.4, 38, 23.14, 357/41, 43, 46; 257/133, 146, 154, 163, 167, 175, 329, 331, 334, 337, 378, 379

[56] References Cited

U.S. PATENT DOCUMENTS 4,959,703  9/1990  Ogura et al. ........................... 357/38

FOREIGN PATENT DOCUMENTS 0336393 10/1989 European Pat. Off. .
0399530 11/1990 European Pat. Off. .

*Primary Examiner*—Andrew J. James
*Assistant Examiner*—Ngan Van Ngo
*Attorney, Agent, or Firm*—Townsend & Townsend Khourie and Crew

[57] ABSTRACT

A conductivity modulation type MISFET, and a control circuit thereof are provided. A semiconductor device 1 comprises a conductivity modulation type MOSFET 1a and a built-in MOSFET 1b which is designed to control a source electrode 12a and a control electrode 13 of a parasitic transistor to be in a short state or an open state, said conductivity modulation type MOSFET 1a having a polysilicon gate 6 on an obverse surface of n$^-$-type conductivity modulation layer 4, a p-type channel diffusion area 7, n$^+$-type source diffusion area 8 and a parasitic transistor control electrode 13 conductively connected to the p-type channel diffusion area 7 through a p$^+$-type contact area 9.

4 Claims, 4 Drawing Sheets

FIG. 1

PRIOR ART

FIG. 2

PRIOR ART

CONDUCTIVITY MODULATION TYPE MISFET AND A CONTROL CIRCUIT THEREOF

BACKGROUND OF THE INVENTION

1. Field of the Invention

The present invention relates to a conductivity modulation type MISFET and a control circuit thereof and more particularly, a conductivity modulation type MISFET provided with a parasitic transistor control electrode for controlling its internal parasitic transistor, a control circuit thereof.

2. Description of the Prior Art

Figure 1:
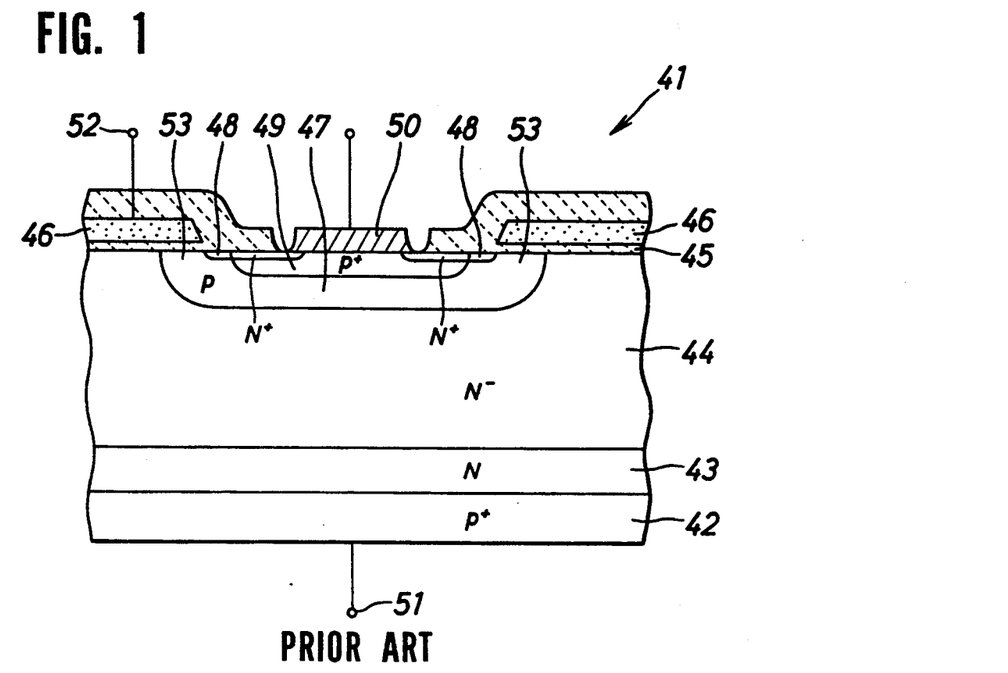
FIG. 1 is a cross sectional view of a conventional conductivity modulation type MOSFET.

A conductivity modulation type MISFET such as insulation gate type bipolar transistor and IGBT incorporating a bipolar transistor despite of having a similar construction to a power MOSFET, is a voltage control type device and featured with a low ON voltage. A typical construction is shown in FIG. 1. In FIG. 1, a conductivity modulation type MOSFET 41 comprises a $p^+$-type semiconductor board 42 which is a drain area, an n type buffer layer 43 formed on an obverse surface of the board 42, an $n^-$-type conductivity modulation layer 44 which isepitaxially formed on the obverse surface, a p-type channel diffusion area 47 which is diffusion-formed with a polysilicon gate 46, which is formed on a silicon oxidized film 45 on the obverse surface, as a mask, and an $n^+$-type source diffusion area 48 on the obverse surface. In this case, a parasitic transistor of an n-p-n construction comprises an $n^+$-type source diffusion area 48, a p type channel diffusion area 47 and an $n^-$-type conductivity modulation layer 44 (n-type buffer layer 43). Therefore, when a large current is supplied to the conductivity modulation type MOSFET 41, the parasitic transistor, that is, a parasitic thyristor formed by an $n^+$-type source diffusion area 48, a p-type channel diffusion area 47, an $n^-$-type conductivity modulation layer 44 (n-type buffer layer 43) and a $p^+$-type semiconductor board 42 becomes ON (latch-up phenomenon) due to a voltage drop in the p-type channel diffusion area 47 just below the $n^+$-type source diffusion area 48 and a turn-off control of the conductivity modulation type MOSFET 41 is impossible. By forming the $p^+$-type difuusion area 49 and a source electrode 50, which is resistance-connected to this p typechannel diffusion area 47 and the $n^+$-type source diffusion area 48, in the p-type channel difffusion area 49, the voltage drop is controlled to prevent the latch-up phenomenon. A drain electrode is conductively connected to the $p^+$-type semiconductor board 42 and a gate electrode 52 is conductive by connected to the polysilicon gate 46.

Figure 2:
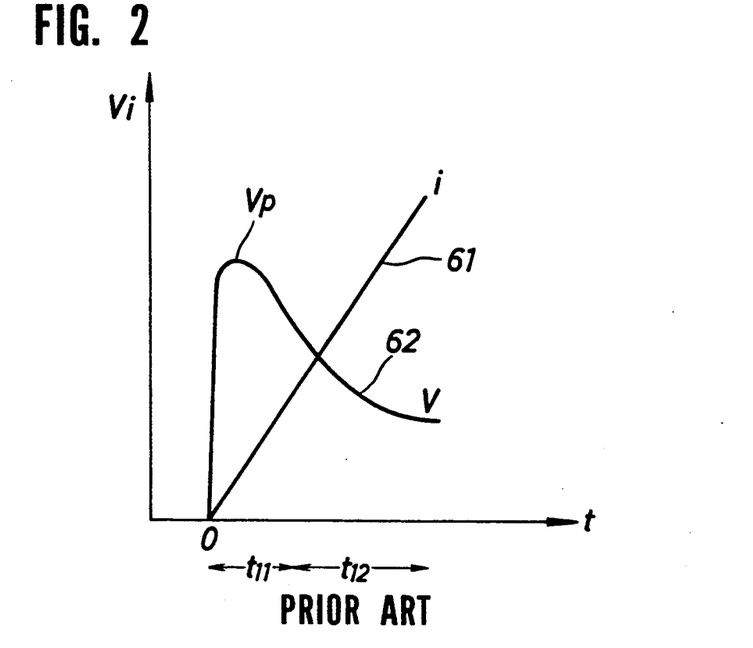
FIG. 2 is a graph showing transient turn on or off characteristics of the conventional conductivity modulationtype MOSFET.

In the conductivity modulation type MOSFET 41 with the construction as described above, when a positive potential is applied to the gate electrode 52 under the condition that the source electrode 50 is grounded and the drain electrode 51 is forced to have a positive potential, an inversion layer is formed on the obverse surface 53 of the p-type channel diffusion area 47 opposing to the polysilicon gate 46 through the silicon oxidized film 45 and electrons are injected into the $n^-$-type conductivity modulation layer 44 and, at the same time, holes are injected from the $p^+$-type semiconductor board 42, through this inversion layer. As a result, the n-type conductivity modulation layer 44 is conductivity modulated and an ON resistance reduces. For example, when a current shown with a solid line 61 in FIG. 2 is supplied to the conductivity modulation type MOSFET 41, a large transient ON voltage Vp is produced from the conductivity modulation type MOSFET 41 at a time $t_{11}$ when the $n^-$-type conductivity modulation layer 44 is not yet fully donductiveity modulated as the change of the ON voltage is shown with a solid line 62, then the $n^-$-type conductivity modulation layer 44 is conductivity-modulated and the ON voltage reduces in time $t_{12}$. This low ON voltage is a feature of the conductivity modulation type MOSFET 41.

Since the operation frequency in the conventional circuit construction is several kHz to several 10 kHz, such transient ON voltage Vp has not been a problem and the turn-off characteristics have mainly been improved by employing an anode-short construction. However, if the operating temperature is higher than the above, the turn-off operation is carried out before the $n^-$-type conductivity modulation layer 44 is conductivity-modulated and therefore the conductivity modulation type MOSFET 41 does not exhibit a low ON voltage which should be an advantage and, on the contrary, noise and increase of loss caused by to a transient ON voltage Vp have been problems.

SUMMARY OF THE INVENTION

It is a first object of the present invention to provide a conductivity modulation type MISFET of which transient ON characteristics in the turn-on operation are improved.

It is a second object of the present invention to Provide a control circuit of the conductivity mdulation MISFET.

In order to solve the above described problems, there are provided according to the present invention a first conduction type conductivity modulation layer, a first conduction type MIS part provided with a gate electrode on its obverse surface side, a first conduction type source area provided with a source electrode on the obverse surface side of a second conduction type channel diffusion layer of the MIS part and a second conduction type drain area provided with a drain electrode which is conductive connected to the conductivity modulation layer in an area isolated from the MIS part and a parasitic transistor control electrode is conductive-connecetd to the channel diffusion layer. Accordingly, in this case, the conductivity modulation type MISFET has a parasitic transistor control electrode (a base electrode of a parasitic transistor), a source electrode, a gate electrode and a drain electrode in a 4-terminal construction.

In this case, it is preferable that a high density second conductive contact area which is isolated from the source area is formed on the obverse surface side of the channel diffusion layer and the parasitic transistor control electrode is conductive-connected to the channel diffusion layer so that the parasitic transistor control electrode is certainly resistance-sistance-connected to the channel diffusion layer even though, for example, the channel diffusion layer is formed as a higher resistance area than the channel diffusion layer of a common conductivity modulation type MISFET to make the parasitic transistor to be easily ON state.

In the conductivity modulation type MISFET with the construction as described above, it is preferable that the parasitic transistor control electrode and the source electrode employ the control circuit which is controlled to a short state or an open state by an external MISFET connected to these electrodes to turn on or off the parasitic transistor in a simple circuit configuration.

In addition, it is preferable that an MISFET, which is provided with a source area and a drain area to which switching devices such as, for example, a transistor control electrode and a source electrode to which the parasitic transistor control electrode and the source electrode are conductive-connected in an area isolated from the conductivity modulation type MISFET to change over a circuit between these electrodes to a short state or an open state is formed on a semiconductor board on which the conductivity modulation type MISFET, instead of the external MISFET for the above control circuit. In thiscase, the semiconductor device has a gate electrode at the MISFET and a source electrode, a gate electrode and a drain electrode at the conductivity modulation type MISFET in a 4-terminal construction.

DETAILED DESCRIPTION OF PREFERRED EMBODIMENTS

Figure 3:
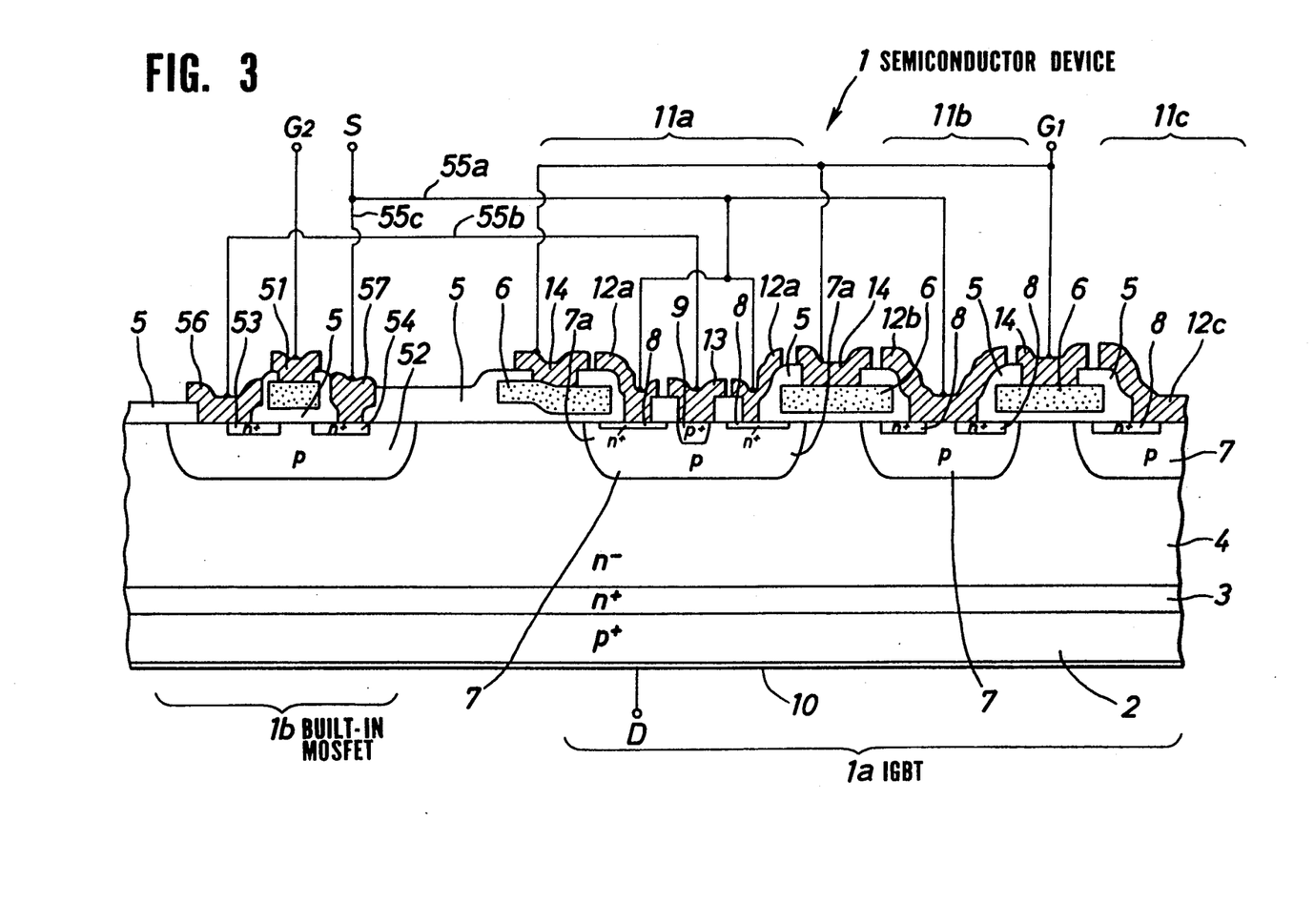
FIG. 3 is a cross sectional view of a semiconductor device according to a first embodiment 1 of the present invention.

Preferred embodiments of the present invention, will now be described by reference to the accompanying drawings. FIG. 3 is a cross sectional view showing the construction of the semiconductor device provided with the conductivity modulation type MOSFET (hereinafter referred to as "IGBT") in accordance with a first embodiment of the present invention.

In FIG. 3, a semiconductor device 1 has a p+-type semiconductor board 2 which serves as a drain area, an n+-type buffer layer 3 formed on the obverse surface of the board 2, and an n−-type conductivity modulation layer 4 and a plurality of MOS parts of the IGBT 1a are formed on the obverse surface of the semiconductor device. In these MOS parts, the p-type channel diffusion area 7 and-the obverse side n+-type source diffusion area 8 are formed by double diffusion with polysilicon gates 6 respectively formed on a silicon oxidized film 5 as a mask, and the first MOS part 11a, the second MOS part 11b and the third MOS part 11c of the IGBT 1a are formed with polysilicon gates 6, p-type channel diffusion area 7 and n-type source diffusion area 8.

In the semiconductor device 1 according to this embodiment, the first MOS 11a of these MOS parts has a p+-type contact area 9 formed in an area isolated from the n+-type source diffusion area 8 on the obverse surface of the p-type channel diffusion area 7, and the parasitic transistor control electrode 13 is resistance connected only to this p+-type contact area 9 and the source electrode 12a is conductive by connected only to the n+-type source diffusion area 8 and the source electrode 12a is not conductive-connected to the p+-type contact area 9. On the contrary, in the second and third MOS parts 11b and 11c, the source electrodes 12b and 12c are conductively connected to the n+-type source diffusion area 8 and also to the p-type channel diffusion area 7 as the conventional IGBT. In this case, for MOS parts of the IGBT 1a, the source terminals S are conductive-connected to the source electrodes 12a, 12b and 12c through the first wiring layer 55a as an external wiring layer. The first gate terminalG1 is conductive by connected to polysilicon gates 6 through the gate electrode 14 and moreover the drain terminal D isconductively connecetd to the drain electrode 10.

On the obverse surface of the n−-type conductivity modulation layer 4, the p-type Channel diffusion area 52 and the n+-type source diffusion area 53 and the n+-type drain diffusion area 54 on the obverse surface are formed on the area isolated from the area where the IGBT 1a is formed, by double diffusion with the polysilicon gate 51 formed on the silicon oxidized film 5 as a mask, and a horizontal type built-in MOSFET 1b is formed with the polysilicon gate 51, p-type channel diffusion area 52, n+-type source diffusion area 53 and the n+-type drain diffusion area 54. In this case, the source electrode 56 is conductively connected to the n+-type source diffusion area 53 and the p-type channel diffusion area 52 and the drain electrode 57 is conductively connected to the n+-type drain diffusion area 54 and the p type channel diffusion area 52. While the source electrode 56 is conductively connected to the parasitic transistor control electrode 13 of the first MOS part 11a of the IGBT 1a through the second wiring layer 55b as an external wiring layer, the drain electrode 57 is conductively connected to the source electrodes 12a, 12b 12c of the IGBT 1a through the third wiring layer 55c. The gate electrode 51 of the built-in MOSFET 1b is conductively connected to the second gate terminal C2. Therefore, the semiconductor device 1 of this embodiment has a 4-terminal construction comprising the drain terminal D of the IGBT 1a side, the source terminal S to which the source electrodes 12a, 12b and 12c of the IGBT 1a and the drain electrode 57 of the built-in MOSFET 1b are conductively connected, the first gate terminal G1 conductively connected the gate electrode 14 of the IGBT 1a and the second gate terminal G2 conductively connected to the gate electrode 59 of the built-in MOSFET 1b.

At the IGBT 1a, for example, the first MOS part 11a, a transistor of a p-n-p construction n-based on the n−-conductivity modulation layer 4 (n+-type buffer layer 3) is formed with the p-type channel diffusion area 7, the n−-type conductivity modulation layer 4 and the p+-type semiconductor board 2 and a parasitic transistor of an n-p-n construction is formed with the n+-type source diffusion area 8, the p-type channel diffusion area 7 and the n−-type conductivity modulation layer 4. The parasitic transistor control electrode 13 is conductively connected to the p-type channel diffusion area 7 which is a p base for this parasitic transistor of n-p-n construction. Accordingly, the parasitic transistor control electrode 13 can be regarded as a gate electrode of the parasitic thyristor with an n-p-n-p construction which comprises the n+-typesource diffusion area 8, the p type channel diffusion area 7, the n⁻-type conductivity modulation layer 4(n-type buffer layer 3) and the p⁺-type semiconductor board 2.

Figure 4:
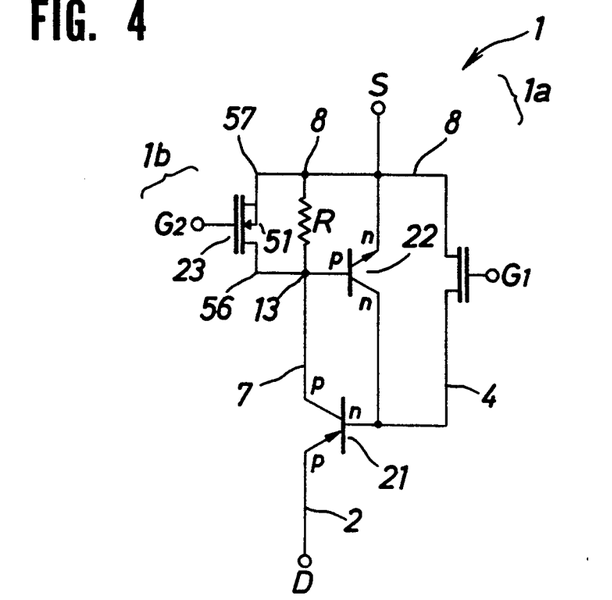
FIG. 4 is an equivalent circuit diagram showing the construction of the semiconductor device shown in FIG. 3.

The following describes the equivalent circuit which is the main part of the semiconductor device 1 with the above described construction, that is, the equivalent circuits of the first MOS part 11a of the IGBT 1a and the built-in MOSFET 1b, referring to FIG. 4.

As shown in FIG. 4, the transistor 21 of p-n-p construction which is n-based on the n⁻-type conductivity modulation layer 4 (n⁺-type buffer layer 3), the gate terminal $G_1$ conductively connected to the polysilicon gate 6 of the first MOS part 11a through the gate electrode 14and the parasitic transistor 22 of n-p-n construction which is p-based on the p-type channel diffusion area 7 are provided between the source terminal S and the drainterminal D at the IGBT 1a of the semiconductor device 1. In this case, R is a short circuit resistance of the p-type channel diffusion area 7 just below the n⁺-type source diffusion area 8 and the built-in MOSFET 1b as a switching element is connected in parallel to this short circuit resistance R, that is, connected between the source electrode 12a and the parasitic transistor control electrode 13 of the IGBT 1a. The built-in MOSFET 1b used in this embodiment is connected to the IGBT 1a with a source potential and therefore it does not require a large withstand voltage and can have an extremely small capacity.

Figure 5:
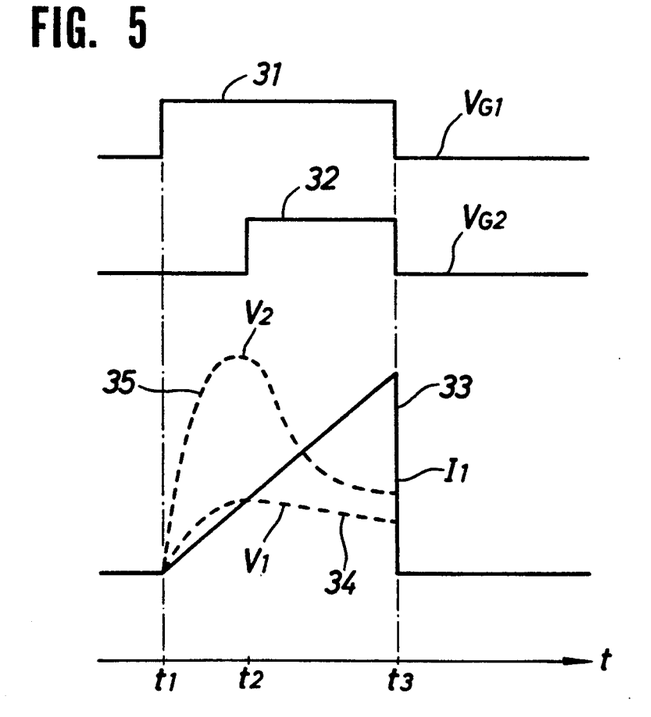
FIG. 5 is a timing chart showing the operation of the conductivity modulation type MOSFET according to the embodiments of the present invention.

The operation of the semiconductor device 1 is described below, referring to the timing chart shown in FIG. 5. Solid lines 31, 32 and 33 respectively show the gate drive signal $V_{G1}$ applied to the first gate terminal $G_1$ of the semiconductor device 1 (IGBT 1a), the gate drive signal $V_{G2}$ applied to the second gate terminal $G_2$ of the semiconductor device 1 (MOSFET 1b) and the current waveform $I_1$ between the source terminal S and the drain terminal D of the semiconductor device 1 (IGBT 1a), and the broken line 34 shows the voltage waveform $V_1$ across the source terminal S and the drain terminal D of the semiconductor device 1 (IGBT 1a).

At the IGBT 1a, the source electrodes 12a, 12b and 12care grounded with the minimum potential and the drain electrode 10 is given a positive potential. Under this state, the IGBT 1a, the built-in MOSFET 1b and the parasitic transistor 22 (parasitic thyristor) are kept off.

When a pulse of gate drive signal $V_{G1}$ is applied to the gate terminal $G_1$ at time $T_1$, the polysilicon gate 6 has a positive potential at the IGBT 1a, an inversion layer is formed on the obverse surface 7a of the p-type channel diffusion area 7 which is opposed to this polysilicon gate 6 through the silicon oxidized film 5, and electrons are injected into the n⁻-type conductivity modulation layer 4 and holes are injected from the p⁺-type semiconductor board 42 into the n⁻-type conductivity modulation 4, through the inversion layer. In this case, the source electrode 12a is conductively connected only to the n⁺-type source diffusion area 8 and is not conductively connected to the p⁺-type contact area 9 and therefore the sort circuit resistance R just below the n⁺-type source diffusion area 8 is relatively large. When a voltage drop due to the hole current and the short circuit resistance R in the p-type channel diffusion area 7 takes place, the p-type channel diffusion area 7 has a positive potential to the n⁺-type diffusion area 8 and the parasitic transistor 22 formed by the n⁺-type source diffusion area 8, p-type channel diffusion area 7 and n⁻-type conductivity modulation layer 4 is turned on (latch-up phenomenon). In other words, the parasitic thyristor is turned on, electrons are injected from the n⁺-type source diffusion area 8 into the p-type channel diffusion area 7 and, in addition, into the n⁻-type conductivity modulation layer 4. Therefore, an electron injecting passage with the parasitic transistor (parasitic thyristor) is formed in the IGBT 1a in addition to a common electron injecting passage and electrons are quickly collected by the n⁻-type conductivity modulation layer 4 and the holes are quickly injected from the p⁺-type semiconductor board 2 at the same time as a turn-on operation. Therefore, the n⁻-type conductivity modulation layer 4 is conductivity-modulated from the beginning of the turn-on operation. Accordingly, the ON voltage $V_1$ is low from the beginning of the turn-off operation as shown with the broken line 34 even when the current $I_1$ shown with the solid line 33 is supplied to the semiconductor device 1, and a high transient ON voltage as the ON voltage $V_2$ of the conventional IGBT shown with the broken line 35 is not produced. In other words, the semiconductor device 1 of this embodiment does not show the diode type transient characteristics as the conventional IGBT and shows the thyristor type transient characteristics. At the IGBT 1a under this condition, the parasitic transistor 22 (parasitic thyristor) is on and cannot be controlled with the gate drive signal $V_{G1}$. Therefore, when a pulse of gate drive signal $V_{G2}$ is applied to the second gate terminal $G_2$ at time $t_2$ to turn on the MOSFET 1b, the n⁺-type source diffusion area 53 and the n⁺-type drain diffusion area 54 are conductive and the p-type channel diffusion area 7 and the n⁺-type source diffusion area 8 at the IGBT 1a are short-circuited. Therefore, the holes of the the p type channel diffusion area 7 are extracted at the source terminal S through the p⁺-type contact area 9 and the p-type channel diffusion area 7 and the n⁺-type source diffusion area 8 have the same potential and the parasitic transistor 22 becomes off. Consequently, the IGBT 1a returns to a normal operating condition from time $t_2$ and is controlled to be turned off with the gate drive signal $V_{G1}$ at time $t_3$.

Thus, the semiconductor device 1 according to this embodiment has the parasitic transistor control electrode 13 for turning on and off the parasitic transistor 22 and the MOSFET 1b which is connected between the source electrode 12a and the parasitic transistor control electrode 13 to make them short-circuited or open, in addition to the source electrodes 12a, 12b and 12c, the drain electrode 10 and the gate electrode 11 which are generally provided for the IGBT 1a. Therefore, the MOSFET 1b is kept off, the carrier entry speed into the n⁻-conductivity modulation layer 4 is raised by the positive feedback at the IGBT 1a, the n⁻-type conductivity modulation layer 4 is quickly conductivity-modulated and the IGBT 1a is constantly kept on from the beginning of the turn-off operation. Accordingly, even when the operating frequency is high, the IGBT 1a shows a low ON voltage from the beginning of its ON operation and therefore the ON loss is small and the noise can be prevented. For this reason, if the semiconductor device 1 of this embodiment is uaed in a switching circuit, for example, for a power supply unit, a switching loss is low and a conversion efficiency can be raised. On the other hand, though the first MOS part 1a of the IGBT 1a is constructed to be apt to cause the latch-up phenomenon, the parasitic transistor control electrode 13 is short-circuited to the source electrode 12a by an ON operation of the MOSFET 1b after the transient turn-on operation andcertainly resistance-connected to the p type channel diffusion area 7 through the p+-type contact area 9. Therefore, the latch-up condition is cancelled and the recurrence of latch-up phenomenon is prevented.

In the semiconductor device 1 according to the embodiment, an external wiring layer is used for wiring connection from the built-in MOSFET 1b to the IGBT 1a but a wiring layer formed on the surface of the semiconductor board can be used without being limited to the above.

Figure 6:
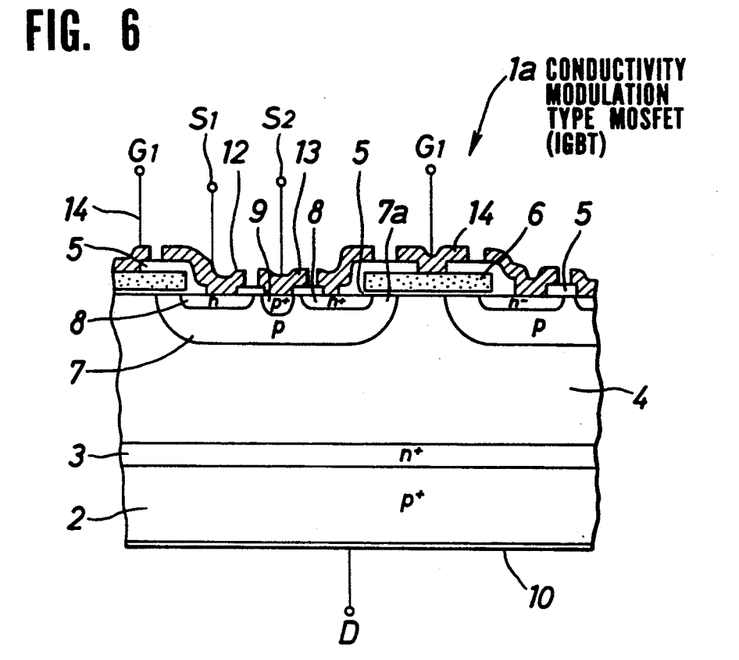
FIG. 6 is a cross sectional view of the conductivity modulation type MOSFET according to a second embodiment of the present invention.

The following describes a semiconductor device provided with an IGBT according to a second embodiment 2 of the present invention by reference to FIG. 6. The semiconductor device of this embodiment controls the parasitic transistor of the IGBT with the external MOSFET of the control circuit externally provided, instead of the built-in MOSFET in the semiconductor device according to the first embodiment. The basic configuration of the IGBT according to the second embodiment is the same as that of the semiconductor device according to the first embodiment and the corresponding parts are given the same reference numerals.

FIG. 6 is a cross sectional view showing the construction of the conductivity modulation type MOSFET (hereinafter referred to as the "IGBT") according to this embodiment.

In FIG. 6, an IGBT 1 comprises a p+-type semiconductor board 2 which is a drain area, an n+-type buffer layer 3 formed on the obverse surface of the semiconductor board 2, an n⁻-type conductivity modulation layer 4 epitaxially formed on the semiconductor board 2, and a p-type channel diffusion area 7 and an obverse side n+-type source diffusion area 8 which are formed byy double diffusion with a polysilicon gate 6 formed on a silicon oxidized film 5 on the obverse surface as a mask, and the MOS part is formed with the polysilicon gate 6, the p-type channel diffusion area 7 and the n+-type source diffusion area 8. In this case, the n+-type source diffusion area 8 is formed as currenlty on the obverse surface of the p-type channel diffusion area 7. In this embodiment, the p+-type contact area 9 is internally formed in an area isolated from the n+-type source diffusion area 8 and the parasitic transistor control electrode 13 is resistancely connected to this p+ type contact area 9. The IGBT 1a has the 4-terminal construction comprising a drain terminal D conductively connected to the p+-type semiconductor board 2 through a drain electrode 10, a gate terminal, that is, the firstgate terminal G₁ conductive-connected to the polysilicongate 6 on the obverse surface of the p+-type semiconductor board 2 through an electrode 14, a source terminal S₁ conductively connected only to the n+-type source diffusion area 8 through a source electrode 12 and a parasitic transistor control terminal S₂ conductively connected to the p+-type contact area 9 (p-type channel diffusion area 7) through the parasitic transistor control electrode 13.

Also in the IGBT 1a with the above described construction, as in case of the semiconductor device of the embodiment 1, a transistor of p-n-p construction which is n-based on the n⁻-type conductivity modulation layer 4 is formed with the p type channel diffusion area 7, n⁻-type conductivity modulation layer 4 (n+-type buffer layer 3) and the p+-type semiconductor board 2, while a parasitic transistor of n-p-n construction si formed with the n+-type source diffusion area 8, the p-type channel diffusion area 7 and the n⁻-type conductivity modulation layer 4. The parasitic transistor control electrode 13 is conductively connected to the p-type channel diffusion area 7 which is the p-base for the parasitic transistor of n-p-n construction. Therefore, the parasitictransistor control electrode 13 can be regarded as a gate electrode for a parasitic thyristor of n-p-n-p construction formed with the n+-type source diffusion area 8, the p-type channel diffusion area 7, the n⁻-type conductivity modulation layer 4 (n+-type buffer layer 3) and the p+ type semiconductor board 2. The p type channel diffusion area 7 of this embodiment is formed to have a high resistance, contrary to the conventional IGBT, so that the parasitic transistor of n-p-n construction may easily turn on.

The equivalent circuit of the IGBT 1a of this embodiment is described below by reference to FIG. 7.

Figure 7:
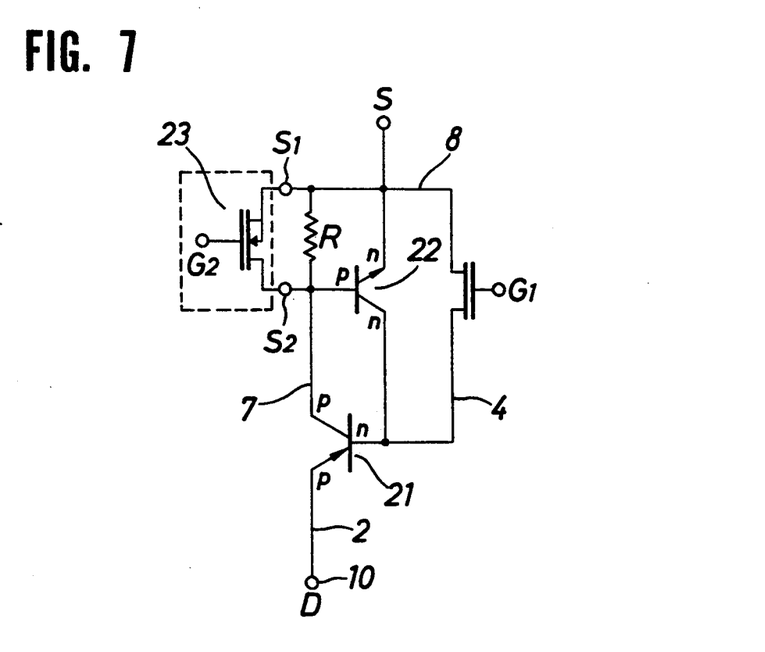
FIG. 7 is an equivalent circuit diagram showing the construction of the conductivity modulation type MOSFET shown in FIG. 6.

In FIG. 7, a transistor 21 of p-n-p construction which is n-based on the n⁻-type conductivity modulation layer 4 (n+-type buffer layer 3), a gate terminal G₁ of an MOS part conductively connected to the polysilicon gate 6 through a gate electrode 14 and a parasitic transistor 22 of n-p-n construction which is p-based on the p-type chanel diffusion area 7 between the source terminal S (source terminal S₁) and the drain terminal D of the IGBT 1a. In the drawing, R is a short circuit resistance of the p-type channel diffusion area 7 just below the n+-type source diffusion area 8. The IGBT 1a of this embodiment is used under the condition that it is connected in parallel to this short circuit resistance R, in other words, an MOSFET 23 externally provided as a switching element for a control circuit is connected between the source terminal S₁ and the parasitic transistor control terminal S₂. The external MOSFET 23 used in this embodiment is connected to the IGBT 1a with a source potential and therefore does not require a large withstand voltage and an inexpensive MOSFET with an extremely small capacity is satisfactory.

The operation of the IGBT 1a is described below. Since the operation is the same as that of the IGBT side of the semiconductor device according to the embodiment 1, it is described referring to the timing chart shown in FIG. 3. In the drawing, solid lines 31, 32 and 33 nad the broken line 34 respectively show the gate drive signal $V_{G1}$ applied to the first gate terminal G₁ of the IGBT 1a, the gate drive signal $V_{G2}$ applied to the gate terminal of the external MOSFET 23, that is, the second gate terminal G₂, the current waveform I₁ of the IGBT 1a and the voltage waveform V₁ of the IGBT 1a.

The source electrode 12 of the IGBT 1a is given the minimum potential (grounded) and the drain electrode10 is given a positive potential. Under this condition, the IGBT 1a, the external MOSFET 23 and the parasitic transistor 22 (parasitic thyristor) are off.

When a pulse of gate drive signal $V_{G1}$ is applied to the first gate terminal G₁ at time t₁, the polysilicon gate 6 has a positive potential, an inversionlayer is formed on the obverse surface 7a of the p-type channel diffusion area 7 which is opposed to this polysilicon gate 6 through the silicon oxidized film 5, and electrons are injected into the n⁻-type conductivity modulation layer 4 and holes are injected from the p⁻-type semiconductor board 42 into the n⁻-type conductivity modulation 4, through the inversion layer. In this embodiment, the p-type channel diffusion area 7 is formed to have a high resistance and a large short circuit resistance R. When a voltage drop due to the hole currentand the short circuit resistance R in the p-type channel diffusion area 7 just below the n+type source diffusion area takes place, the p-type channel diffusion area 7 has a positive potential to the n+-type diffusion area 8 and the parasitic transistor 22 formed by the n+-type source diffusion area 8, p-type channel diffusion area 7 and n−-type conductivity modulation layer 4 is turned on. In other words, the parasitic thyristor is turned on, electrons are injected from the n+-type source diffusion area 8 into the p-type channel diffusion area 7 and, in addition, into the n−-type conductivity modulation layer 4. Therefore, an electron injecting passage with the parasitic transistor (parasitic thyristor) is formed in the IGBT 1a in addition to a common electron injecting passage and electrons are quickly collected by the n−-type conductivity modulation layer 4 and the holes are quickly injected from the p+-type semiconductor board 42 at the same time when a turn-on operation is carried out. Therefore, the n−-type conductivity modulation layer 4 is conductivity-modulated at the beginning of the turn-on operation. Accordingly, the ON voltage $V_1$ is low from the beginning of the turn-off operation as shown with the broken line 34 even when the current $I_1$ shown with the solid line 33 is supplied to the IGBT 1a, and a high transient ON voltage as the ON voltage $V_2$ of the conventional IGBT shown with the broken line 35 is not produced.

In this case, the IGBT 1a cannot be controlled with the gate drive signal $V_{G1}$ since the parasitic transistor 22 is on. The external MOSFET 23 is set to ON by applying the the gate drive signal $V_{G2}$ to the second gate terminal $G_2$ of the external MOSFET 23 at time $t_2$ to short circuit the source terminal $S_1$ and the parasitic transistor control terminal $S_2$. Consequently, the holes of the p-type channel diffusion area 7 are extracted through the p+-type contact area 9, the p-type channel diffusion area 7 and the n+-type source diffusion area 8 become to have the same potential and the parasitic transistor 22 is turned off. Accordingly, time $t_2$, the IGBT 1a returns to the normal IGBT operation and turns off with the gate drive signal $V_{G1}$ at time $t_3$.

Thus, the IGBT 1a according to this embodiment is provided with the parasitic transistor control electrode 13 for turning on and off the parasitic transistor 22 in addition to the common electrodes and the cariers areinjected into the n−-type conductivity modulation layer 4 by turning on the parasitic thyristor. In other words, the carrier injecting speed to the n−-type conductivity modulation layer 4 is increased by the positive feedback of two transistors to make the n−-type conductivity modulation layer 4 quickly conductivity-modulated and therefore the IGBT 1a is constantly kept on from the beginning of the turn-off operation. Accordingly, even when the operating frequency is high, the IGBT 1a shows a low ON voltage from the beginning of the ON operation and the ON loss is low and the noise can be prevented. When the IGBT 1a of this embodiment is used, for example, in a switching circuit of a power supply unit, the switching loss is small and the coversion efficiency can be improved.

The p-type channel diffusion area 7 is formed to provide a high resistance so that a latch-up phenomenon is apt to occur but the parasitic transistor control electrode 13 is resistance-connected to the p+-type contact area 9 formed on the obverse surface of the p-type channel diffusion area 7 and can be certainly conductively connected to the p-type channel diffusion area 7. In addition, after the transient turn-on operation, the source electrode 12 and the parasitic transistor control electrode 13 are short-circuited to cancel the latch-up state of the IGBT 1a and prevent recurrence of the latch-up phenomenon. Moreover, the IGBT 1a capable of performing high speed operation with a simple circuit configuration is realized using an external MOSFET.

In the IGBT of all embodiments, though the conductivity modulation layer 4 is made as an n−-type, a reverse conducting IGBT can be formed by making the areas a reverse conducting type. In addition, an MIS construction can be realized by using a nitride film or the like instead of the MOS construction using a oxide film.

As described above, the present invention is characterized in that a parasitic transistor control electrode is conductively connected to a channel diffusion layer on the obverse surface of the conductivity modulation layer Therefore, according to the present invention, when the IGBT is to be turned on by an external control ciruit or a switching operation of the switching element on the same board as the IGBT, the source electrode and the parasitic transistor control electrode are opened to make the parasitic transistor (parasitic thyristor) ON and carrier injection due to latch-up phenomenon is utilized in addition to regular carrier injection. Accordingly, the conductivity modulation layer is quickly conductivity-modulated and, even when the operating frequency is high, an effect that the ON loss of the conductivity modulation type MISFET is small is obtained. The parasitic transistor can be turned off by short-circuiting the source electrode and the parasitic transistor control electrode and the turn-off operation of the conductivity modulation type MISFET will not be hindered.

If the parasitic transistor control electrode is conductively connected to the channel diffusion layer through th high density second conductive contact area, the resistance level of the channel diffusion layer is raised so that the parasitic thyristor can easily function to obtain an effect that the parasitic transistor control electrode can be certainly conductively connected to the channel diffusion layer.

In addition, if the turn-on or off operation of the parasitic thyristor is controlled by an external MISFET of an external control circuit or the MISFET on the same board, an effect that the control can be done with a simple construction.

What is claimed is:

1. A control circuit for a conductivity modulation type MISFET, the MISFET comprising:
   a first conductive type conductivity modulation layer,
   a fist conductive type MIS part, the MIS part comprising a gate electrode over its obverse surface, a second conductive type channel diffusion layer on the obverse surface of the first conductive type conductivity modulation layer, an insulation film interposed between the gate electrode and the second conductive type channel diffusion layer, a first conductive type source area formed adjacent to the surface of the second conductive type channel diffusion layer;
   a first conductive type source area provided with a source electrode on the obverse surface of the second conductive type channel diffusion layer of said MIS part;
   a second conductive type drain area provided with a drain electrode which is conductively connected to said conductivity modulation layer in an area isolated from said MIS part;

a parasitic transistor control electrode is conductively connected to said channel diffusion layer; and wherein said parasitic transistor control electrode and said source electrode are controlled to be brought into a short-circuited state or an open state by an external MISFET connected to these electrodes.

2. A control circuit for a conductivity modulation type MISFET, the MISFET comprising:

a first conductive type conductivity modulation layer, a first conductive type MIS part, the MIS part comprising a gate electrode over its obverse surface, a second conductive type channel diffusion layer on the obverse surface of the first conductive type conductivity modulation layer, an insulation film interposed between the gate electrode and the second conductive type channel diffusion layer, a first conductive type source area formed adjacent to the surface of the second conductive type channel diffusion layer; 'a first conductive type source area provided with a source electrode on the obverse surface of the second conductive type channel diffusion layer of said MIS part;

a second conductive type drain area provided with a drain electrode which is conductively connected to said conductivity modulation layer in an area isolated from said MIS part;

a parasitic transistor control electrode is conductively connected to said channel diffusion layer;

wherein said channel diffusion layer has a high density second conductive type contact area formed on the obverse surface of said channel diffusion layer to be isolated from said source area and said parasitic transistor control electrode is conductively connected to said channel diffusion layer through said contact area; and wherein said parasitic transistor control electrode and said source electrode are controlled to be brought into a short-circuited state or an open state by an external MISFET connected to these electrodes.

3. A control circuit according to claim 1 or 2 wherein, on a semiconductor substrate on which said conductivity modulation type MISFET is formed, said parasitic transistor control electrode and said source electrode are conductively connected in an area isolated from said conductivity modulation type MISFET and a switching element for switching over a circuit between said control and source electrodes to a short-circuited state or an open state.

4. A control circuit according to claim 3, wherein said switching element is a MISFET provided with a source area and a drain area to which said parasitic transistor control electrode and said source electrode are conductively connected.

* * * * *